US012793751B2

(12) United States Patent
Cho et al.

(10) Patent No.: US 12,793,751 B2
(45) Date of Patent: Nov. 10, 2026

(54) METHOD AND APPARATUS FOR ZQ CALIBRATION OF MEMORY INTERFACE DRIVING CIRCUIT

(71) Applicant: Electronics and Telecommunications Research Institute, Daejeon (KR)

(72) Inventors: Min Hyung Cho, Daejeon (KR); Yi Gyeong Kim, Daejeon (KR); Young Deuk Jeon, Sejong-si (KR); Young Su Kwon, Daejeon (KR); Su Jin Park, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 84 days.

(21) Appl. No.: 18/825,257

(22) Filed: Sep. 5, 2024

(65) Prior Publication Data

US 2025/0078880 A1 Mar. 6, 2025

(30) Foreign Application Priority Data

Sep. 6, 2023 (KR) ........................ 10-2023-0118642
Jul. 12, 2024 (KR) ........................ 10-2024-0092387

(51) Int. Cl.
*G11C 7/10* (2006.01)
*H03K 19/0185* (2006.01)

(52) U.S. Cl.
CPC ... *G11C 7/1048* (2013.01); *H03K 19/018557* (2013.01); *G11C 2207/2254* (2013.01)

(58) Field of Classification Search
None
See application file for complete search history.

(56) References Cited

U.S. PATENT DOCUMENTS

2019/0028102 A1 1/2019 Gans
2019/0081609 A1 3/2019 Kim et al.
(Continued)

FOREIGN PATENT DOCUMENTS

KR 10-1024244 B1 3/2011
KR 10-2011-0035765 B1 4/2011
(Continued)

OTHER PUBLICATIONS

Chang-Kyo Lee, et al., "Dual-Loop Two-Step ZQ Calibration for Dynamic Voltage-Frequency Scaling in LPDDR4 Sdram", Oct. 2018, pp. 2906-2916, vol. 53, No. 10.

*Primary Examiner* — Jany Richardson
(74) *Attorney, Agent, or Firm* — Sughrue Mion, PLLC

(57) ABSTRACT

An apparatus for correcting output impedance of a memory interface driving circuit, the apparatus comprising: a first PD driver including a plurality of first sub PD drivers connected to each other in parallel; a first control unit configured to sequentially change a first control code, the first control code being a combination of control signals for turning the plurality of first sub PD drivers on or off in each pull-down sweep; and a first comparator configured to generate a first output pattern, the first output pattern being a sequence of 0 or 1 representing a result of comparing an output voltage of the first PD driver generated according to the first control code with a first reference voltage, wherein the first control unit determines a first impedance correction code for the memory interface driving circuit from among the sequentially changing first control codes using the first output pattern.

18 Claims, 16 Drawing Sheets

(56) References Cited

U.S. PATENT DOCUMENTS

| | | | | |
|---|---|---|---|---|
| 2022/0115046 | A1 | 4/2022 | Kang et al. | |
| 2022/0148630 | A1 | 5/2022 | Kavala et al. | |
| 2022/0165321 | A1* | 5/2022 | Seo | G11C 7/04 |
| 2022/0263507 | A1 | 8/2022 | Kang | |
| 2023/0138561 | A1* | 5/2023 | Shin | G11C 29/022 326/30 |

FOREIGN PATENT DOCUMENTS

| | | | |
|---|---|---|---|
| KR | 10-2019-0029205 | A | 3/2019 |
| KR | 10-2021-0074990 | A | 6/2021 |
| KR | 10-2022-0049395 | A | 4/2022 |
| KR | 10-2022-0063956 | A | 5/2022 |
| KR | 10-2022-0114135 | A | 8/2022 |
| KR | 10-2023-0064404 | A | 5/2023 |

* cited by examiner

| | Output pattern of comparator (first comparator 612 or second comparator 622) | | | | | | | | | | | | Counting value |
|---|---|---|---|---|---|---|---|---|---|---|---|---|---|
| First output pattern | 1 | 1 | 1 | 1 | 1 | 0 | 0 | 0 | 0 | 0 | 0 | → | 5 |
| Second output pattern | 1 | 1 | 1 | 1 | 0 | 0 | 0 | 0 | 0 | 0 | 0 | → | 4 |
| Third output pattern | 1 | 1 | 1 | 1 | 1 | 1 | 0 | 0 | 0 | 0 | 0 | → | 6 |
| Fourth output pattern | 1 | 1 | 1 | 1 | 0 | 0 | 1 | 0 | 0 | 0 | 0 | → | 5 |

Average calculation → 5

METHOD AND APPARATUS FOR ZQ CALIBRATION OF MEMORY INTERFACE DRIVING CIRCUIT

CROSS-REFERENCE TO RELATED APPLICATIONS

This application claims priority to Patent Application No. 10-2023-0118642, filed on Sep. 6, 2023 and No. 10-2024-0092387, filed on Jul. 12, 2024 in Korea, the entire contents of which are incorporated herein by reference.

BACKGROUND

The present disclosure relates to a method and apparatus for ZQ calibration of memory interface driving circuit.

The statements in this section merely provide background information related to the present disclosure and do not necessarily constitute prior art.

A memory element represented by a dynamic random access memory (DRAM) is widely used as a main memory in substantially all electronic devices that require computation, such as personal computers (PCs), laptops, computer servers, smartphones, tablets, and automobile parts. In order to further improve performance in electronic devices such as PCs, not only a computation speed of a processor must be improved, but also a data input/output speed of a memory must also be improved.

Recently, in the case of a big data processing system using artificial intelligence technology, a demand for a memory with a larger capacity and a higher data transfer speed is rapidly increasing due to the processing of a large amount of data. A DDR5 memory that is currently most widely used in PCs, computer servers, and the like has a transfer speed of up to 6.4 Gbps/pin. In addition, GDDR6 that is one of graphics double data rate (GDDR) memories specialized for artificial intelligence computation and graphics processing unit (GPU) computation in games or the like currently has a high transfer speed of up to 24 Gbps/pin.

For fast data transmission and reception of several GHz or more in a memory interface, it is very important to maintain the integrity of transmitted and received signals, and impedance matching has the greatest impact on signal integrity. In other words, output impedance of a signal transmission unit, impedance of a signal transfer line, and input impedance of a signal reception unit must all match each other to minimize signal loss and distortion due to signal reflection and enable high-speed data transmission and reception.

SUMMARY

A main object of the present disclosure is to provide an output impedance correction method and apparatus for a memory interface driving circuit.

The advantageous effects of the present disclosure are not limited to those described above; other advantageous effects of the present disclosure not mentioned above may be understood clearly by those skilled in the art from the descriptions given below.

An embodiment of the present disclosure provides an apparatus for correcting output impedance of a memory interface driving circuit, the output impedance correction apparatus comprising: a first PD driver including a plurality of first sub PD drivers connected to each other in parallel; a first control unit configured to sequentially change a first control code, the first control code being a combination of control signals for turning the plurality of first sub PD drivers on or off in each pull-down sweep; and a first comparator configured to generate a first output pattern, the first output pattern being a sequence of 0 or 1 representing a result of comparing an output voltage of the first PD driver generated according to the first control code with a first reference voltage, wherein the first control unit determines a first impedance correction code for the memory interface driving circuit from among the sequentially changing first control codes using the first output pattern.

Another embodiment of the present disclosure provides a method for correcting output impedance of a memory interface driving circuit using an output impedance correction apparatus including a plurality of first sub PD drivers connected to each other in parallel, the method comprising: a first control step of sequentially changing a first control code, the first control code being a combination of control signals for turning the plurality of first sub PD drivers on or off in each pull-down sweep; and a first comparison step of generating a first output pattern, the first output pattern being a sequence of 0 or 1 representing a result of comparing an output voltage of the first PD driver generated according to the first control code with a first reference voltage, wherein the first control step includes determining a first impedance correction code for the memory interface driving circuit from among the sequentially changing first control codes using the first output pattern.

As described above, according to the embodiment of the present disclosure, it is possible to minimize an error occurring in a result of output impedance correction due to various noises from devices, circuits, and an operating environment during correction performed in an output impedance correction circuit for the memory interface driving circuit, and thus, to perform more accurate output impedance correction in a data driving circuit.

There is an effect that signal integrity is improved by minimizing an error in a result of output impedance correction due to noise.

Further, since the signal integrity is improved, there is an effect that it is possible to construct a memory interface capable of faster data transfer.

The effects of the present disclosure are not limited to the effects described above, and other effects not described may be clearly understood by those skilled in the art from the description below.

DETAILED DESCRIPTION

Figure 1:
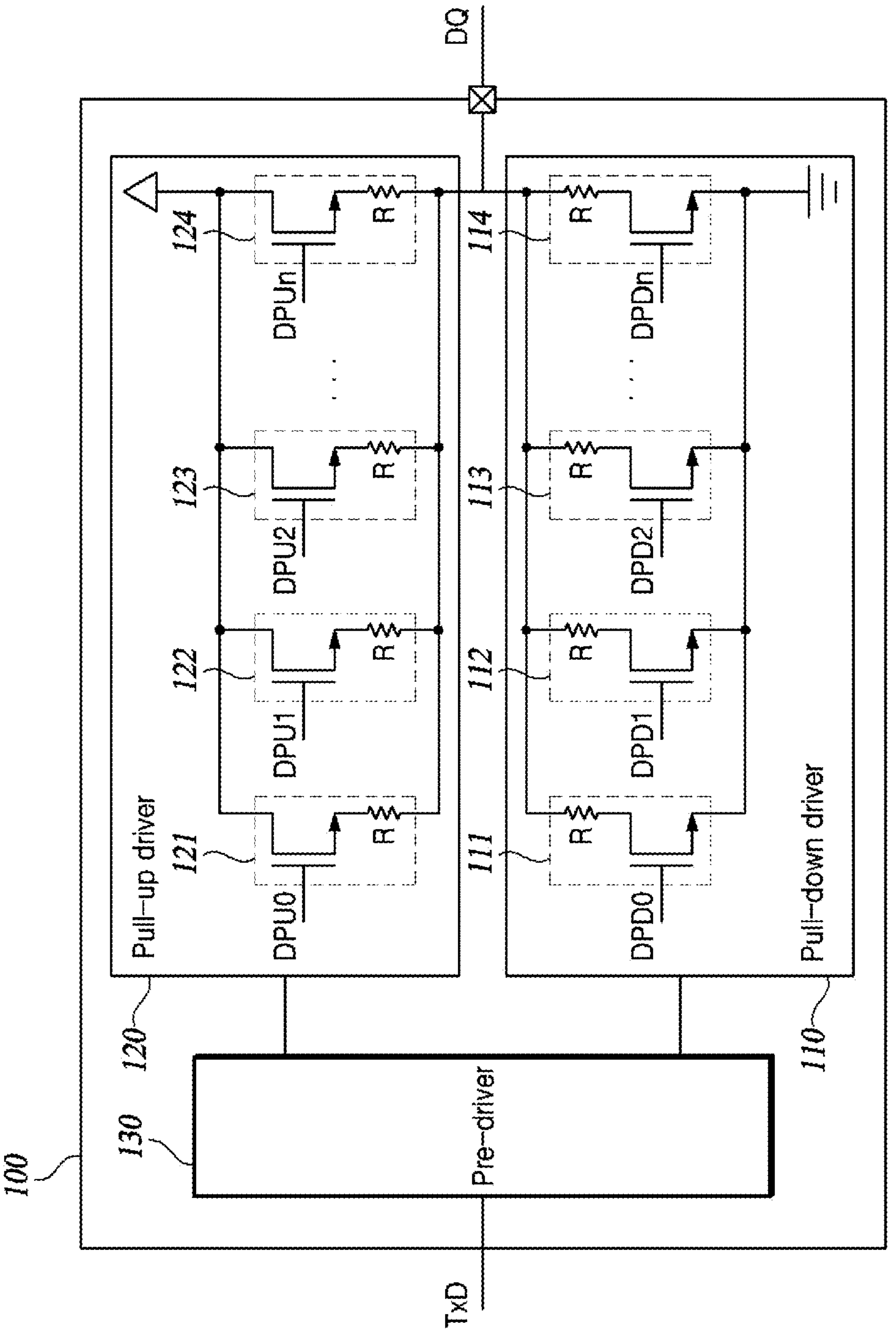
FIG. 1 is a diagram illustrating a memory interface driving circuit of which output impedance can be adjusted.

Hereinafter, some exemplary embodiments of the present disclosure will be described in detail with reference to the accompanying drawings. In the following description, like reference numerals preferably designate like elements, although the elements are shown in different drawings. Further, in the following description of some embodiments, a detailed description of known functions and configurations incorporated therein will be omitted for the purpose of clarity and for brevity.

Additionally, various terms such as first, second, A, B, (a), (b), etc., are used solely to differentiate one component from the other but not to imply or suggest the substances, order, or sequence of the components. Throughout this specification, when a part 'includes' or 'comprises' a component, the part is meant to further include other components, not to exclude thereof unless specifically stated to the contrary. The terms such as 'unit', 'module', and the like refer to one or more units for processing at least one function or operation, which may be implemented by hardware, software, or a combination thereof.

The following detailed description, together with the accompanying drawings, is intended to describe exemplary embodiments of the present invention, and is not intended to represent the only embodiments in which the present invention may be practiced.

The output impedance of the signal transmitter in the memory interface can typically vary by about 30% depending on the manufacturing and operating environment, such as changes in chip manufacturing process, power supply voltage, temperature, etc.

FIG. 1 is a diagram illustrating a memory interface driving circuit of which output impedance can be adjusted.

As illustrated in FIG. 1, a memory interface driving circuit 100 includes a pull-down driver 110, a pull-up driver 120, and a pre-driver 130.

The pull-down driver 110 functions to transfer a logic low of TxD, which is a data input, the pull-up driver 120 functions to transfer a logic high of TxD, and the pre-driver 130 generates a gate signal for selectively driving the pull-down driver 110 or the pull-up driver 120 depending on the Txd input.

The output impedance of the memory interface driving circuit 100 is determined depending on first impedance of the resistor element R connected to the output terminal DQ and second impedance of a metal oxide semiconductor (MOS) element that is turned on in each of the driver 110 and 120.

Incidentally, values of the first and second impedances change within a certain range due to change in process, voltage, and temperature (PVT).

Change in impedance due to a process is change in element impedance value that occurs in a semiconductor chip manufacturing process, change in impedance due to a voltage is change in an impedance value depending on a condition of a voltage applied to each element under operating conditions of a circuit, and change in impedance due to a temperature is change in an impedance value depending on change in surrounding temperature in a circuit operation.

This change in element impedance value due to the PVT change may change to up to 30% from a design value. When the element impedance value changes to be different from the design value due to various causes, the output impedance of the memory interface driving circuit 100 also changes.

When the output impedance of the memory interface driving circuit 100 changes and does not match impedance of a signal reception stage, a transferred signal is reflected at the signal reception stage and is not correctly transferred, and a voltage level at the signal reception stage also changes so that transferred data is not correctly received. When such a change in output impedance occurs, the output impedance of the memory interface driving circuit 100 must be corrected (ZQ calibration).

In FIG. 1, the pull-down driver 110 and the pull-up driver 120 include a plurality of sub pull-down drivers 111, 112, 113, and 114 and a plurality of sub pull-up drivers 121, 122, 123, and 124 that are connected to each other in parallel, respectively. Different output impedances are determined depending on a combination the number of sub pull-down drivers that have been turned on and the number of sub pull-up drivers that have been turned on among the plurality of sub pull-down drivers 111, 112, 113, and 114 and the plurality of sub pull-up drivers 121, 122, 123, and 124.

The plurality of sub pull-down drivers 111, 112, 113, and 114 and the plurality of sub pull-up drivers 121, 122, 123, and 124 may be configured to have the same output impedance. Further, the plurality of sub pull-down drivers 111, 112, 113, and 114 may be configured to have a binary-weighted relationship with each other, and the plurality of sub pull-up drivers 121, 122, 123, and 124 may be configured to have a binary-weighted relationship with each other. Further, the plurality of sub pull-down drivers 111, 112, 113, and 114 and the plurality of sub pull-up drivers 121, 122, 123, and 124 may be configured variously depending on an output impedance control scheme and, for example, the plurality of sub pull-down drivers 111, 112, 113, and 114 may be configured to have different output impedance ratios and the plurality of sub pull-up drivers 121, 122, 123, and 124 may be configured to have different output impedance ratios.

An output impedance correction process refers to a process of finding a combination of sub pull-down drivers to be turned on and sub pull-up drivers to be turned on so that the plurality of sub pull-down drivers 111, 112, 113, and 114 configured in parallel and the plurality of sub pull-up drivers 121, 122, 123, and 124 configured in parallel have desired output impedance values.

Figure 2:
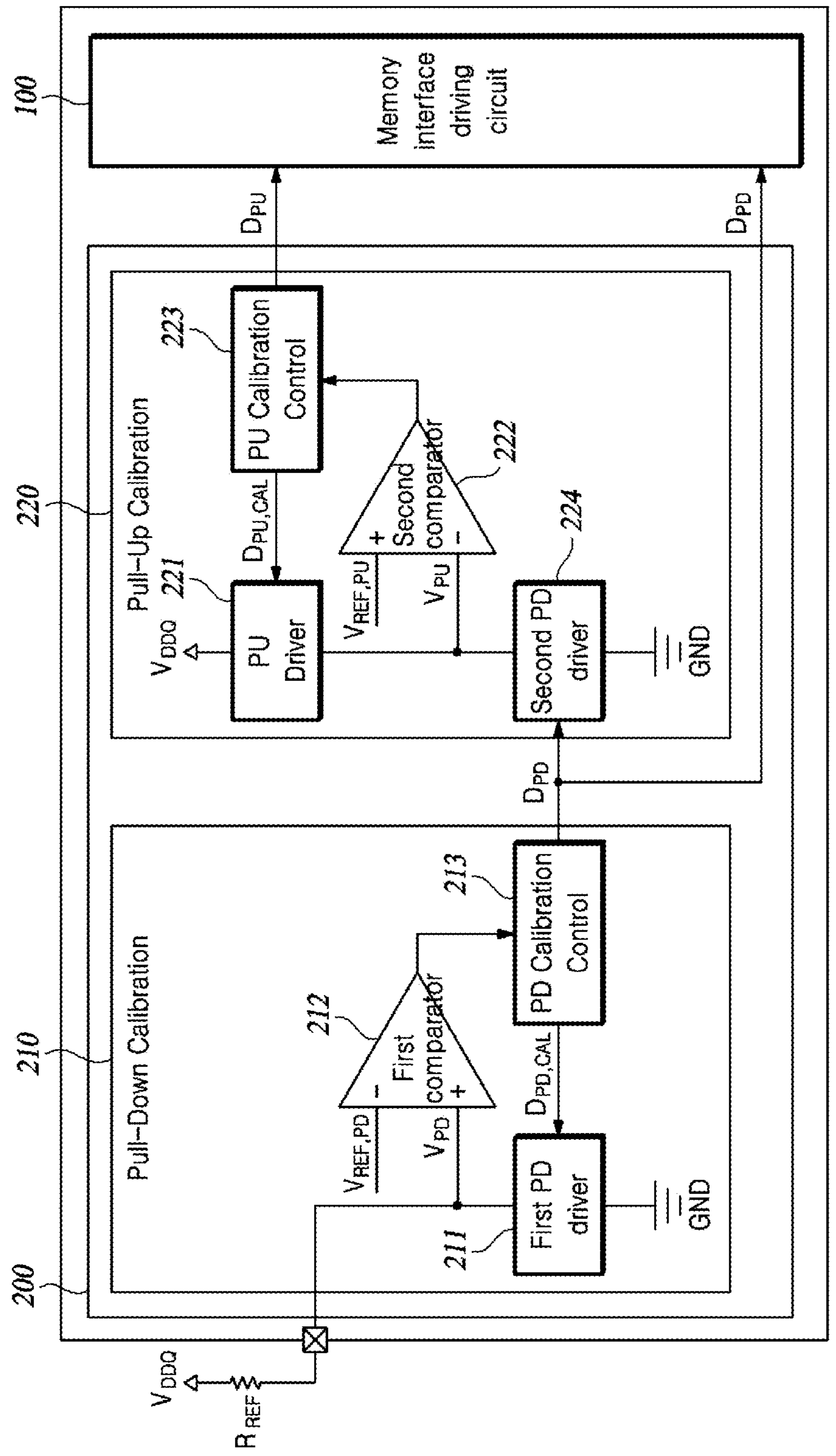
FIG. 2 is a diagram illustrating a structure of an impedance correction circuit 200 for correcting output impedance of a general memory interface driving circuit.

FIG. 2 is a diagram illustrating a structure of an impedance correction circuit 200 for correcting output impedance of a general memory interface driving circuit.

Since the memory interface driving circuit 100 includes the pull-down driver 110 for transmission of a logic low signal and the pull-up driver 120 for transmission of a logic high signal as illustrated in FIG. 1, correction for the pull-down driver 110 (that is, pull-down (PD) calibration) and correction for the pull-up driver 120 (that is, pull-up (PU) calibration) must be performed for output impedance correction.

Therefore, as illustrated in FIG. 2, the impedance correction circuit 200 includes a pull-down calibration block 210 for performing correction on the pull-down driver 110, and a pull-up calibration block 220 for performing correction on the pull-up driver 120.

In FIG. 2, a first PD driver 211 is a circuit having the same configuration as the pull-down driver 110 of the memory interface driving circuit 100, and a PU driver 221 has the same circuit configuration as the pull-up driver 120 of the memory interface driving circuit 100.

A first comparator 212 compares a magnitude of $V_{PD}$, which is a voltage that changes depending on output impedance of the first PD driver 211 changing in a calibration process, with a magnitude of a reference voltage $V_{REF,PD}$, and outputs 0 or 1 depending on a result of the comparison, and a second comparator 222 compares the magnitude of $V_{PU}$, which is a voltage that changes depending on output impedance of the PU driver 221 changing in the calibration process, with a magnitude of a reference voltage $V_{REF,PU}$, and outputs 0 or 1 depending on a result of the comparison.

The PD calibration control block 213 receives an output of the first comparator 212, generates a control signal $D_{PD,CAL}$ for performing control so that the plurality of sub pull-down drivers inside the first PD driver 211 are turned on or off, and determines whether or not calibration for the first PD driver 211 (that is, PD calibration) has been completed.

The PU calibration control block 223 receives an output of the second comparator 222, generates a control signals $D_{PU,CAL}$ for performing control so that the plurality of sub pull-up drivers inside the PU driver 221 are turned on or off, and determines whether the calibration for the PU driver 221 (that is, PU calibration) has been completed.

In FIG. 2, the output impedance correction process is as follows.

(1) First, the pull-down calibration block 210 generates a pull-down control code $D_{PD,CAL}$ for correcting output impedance of the pull-down driver 110 of the memory interface driving circuit 100.

The PD calibration control block 213 compares the voltage $V_{PD}$ of the node at which one terminal of a reference resistor $R_{REF}$ is connected to an output terminal of the first PD driver 211 with a reference voltages $V_{REF,PD}$ and performs control so that the plurality of sub pull-down drivers inside the first PD driver 211 are turned on or off and thus, the two voltages becomes equal or a difference between the voltages is minimized. In this case, the $D_{PD,CAL}$ code is obtained by converting gate signals DPD0, DPD1, DPD2, . . . , DPDn for performing control so that the plurality of sub pull-down drivers in the first PD driver 211 are turned on or off, into code.

In order to minimize a voltage difference between (or equalize) the node voltage $V_{PD}$ and the reference voltage $V_{REF,PD}$, the PD calibration control block 213 sets the $D_{PD,CAL}$ code so that all the sub pull-down drivers of the first PD driver 211 are turned off, and then, controls the magnitude of the output impedance of the first PD driver 211 in stages by changing the $D_{PD,CAL}$ code so that the sub pull-down drivers are additionally turned on one by one.

A moment when change from a state in which $V_{PD}$ is higher than $V_{REF,PD}$ to a state in which $V_{PD}$ becomes lower or equal to $V_{REF,PD}$ occurs in a process of comparing the voltage $V_{PD}$ with the voltage $V_{REF,PD}$ depending on change in the $D_{PD,CAL}$ code is a point in time when the output impedance of the first PD driver 211 has been set. That is, this point in time is a point in time when the output impedance of the first PD driver 211 has a value equal to impedance $R_{REF}$ of an external reference resistor, or a point in time when the impedance is set to a value having a minimal difference with $R_{REF}$, which is a value proportional to $R_{REF}$ at a certain rate. In this case, an output impedance value $ZQ_{PD}$ of the first PD driver 211 is determined according to Equation 1.

$$ZQ_{PD} = \frac{V_{REF \cdot PD}}{V_{DDQ} - V_{REF \cdot PD}} \times R_{REF} \qquad \text{[Equation 1]}$$

Here, $V_{DDQ}$ refers to the supply voltage connected to the other terminal of the resistor $R_{REF}$.

The $D_{PD,CAL}$ code for generating $V_{PD}$ at a point in time when $ZQ_{PD}$ is determined among changing $D_{PD,CAL}$ codes is determined as a $D_{PD}$ code, and the $D_{PD}$ code is used as an ON/OFF control code for the plurality of sub pull-down drivers 111, 112, 113, and 114 for adjusting the output impedance of the pull-down driver 110 of the memory interface driving circuit 100.

(2) After the calibration of the pull-down driver 110 is completed, the pull-up calibration block 220 operates to correct the output impedance of the pull-up driver 120 of the memory interface driving circuit 100.

In the calibration for the pull-up driver 120, the output impedance $ZQ_{PD}$ of the pull-down driver 110 is used as a reference resistor instead of the reference resistor $R_{REF}$ at the time of calibration of the pull-down driver 110. To this end, the pull-up calibration block 220 includes a second PD driver 224, and the second PD driver 224 is controlled so that the second PD driver 224 is turned on or off by the $D_{PD}$ code and is set to have the output impedance $ZQ_{PD}$.

The PU calibration control block 223 compares a voltage $V_{PU}$ of a node ($V_{PU}$ node) at which an output terminal of the PU driver 221 is connected to an output terminal of the second PD driver 224 with a reference voltage $V_{REF,PU}$, and performs control so that the plurality of sub pull-up drivers inside the PU driver 221 are turned on or off and thus, the two voltages becomes equal or a difference between voltages is minimized. In this case, the $D_{PU,CAL}$ code is obtained by converting gate signals DPU0, DPU1, DPU2, . . . , DPUn for performing control so that the plurality of sub pull-up drivers in the PU driver 221 are turned on or off, into code.

The PU calibration control block 223 sets the $D_{PU,CAL}$ code so that all the sub pull-up drivers of the PU driver 221 are turned off, and then, controls the magnitude of the output impedance of the PU driver 221 in stages while changing the $D_{PU,CAL}$ code so that the sub pull-up drivers are additionally turned on one by one.

A moment when change from a state in which $V_{PU}$ is lower than $V_{REF,PU}$ to a state in which $V_{PU}$ becomes equal to or higher than $V_{REF,PU}$ occurs in the process of comparing the voltage $V_{PU}$ with the voltage $V_{REF,PU}$ depending on the change in the $D_{PU,CAL}$ code is a point in time at which the output impedance of the PU driver 221 has been set. That is, this point in time is a point in time when the output impedance of the PU driver 221 has a value equal to the output impedance $ZQ_{PD}$ of the second PD driver 224 for which the calibration has been completed, or a point in time when the output impedance is set to a value having a minimal difference with $ZQ_{PD}$, which is a value proportional to $ZQ_{PD}$ at a certain rate. In this case, the output impedance value $ZQ_{PU}$ of the PU driver 221 is determined according to Equation 2.

$$ZQ_{PU} = \frac{V_{DDQ} - V_{REF \cdot PU}}{V_{REF \cdot PU}} \times ZQ_{PD} \quad \text{[Equation 2]}$$

The $D_{PU,CAL}$ code for generating $V_{PU}$ at a point in time when $ZQ_{PU}$ is determined among the changing $D_{PU,CAL}$ codes is determined as the $D_{PU}$ code, and the $D_{PU}$ code is used as an ON/OFF control code of the plurality of sub pull-up drivers for adjusting the output impedance of the pull-up driver 120 of the memory interface driving circuit 100.

Figure 3A:
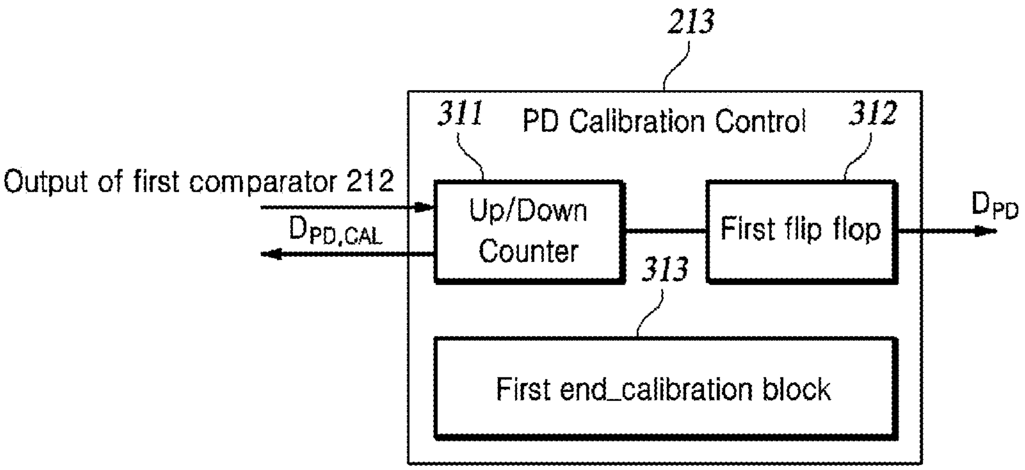
FIG. 3A is a diagram illustrating a configuration of a PD calibration control block 213.
Figure 3B:
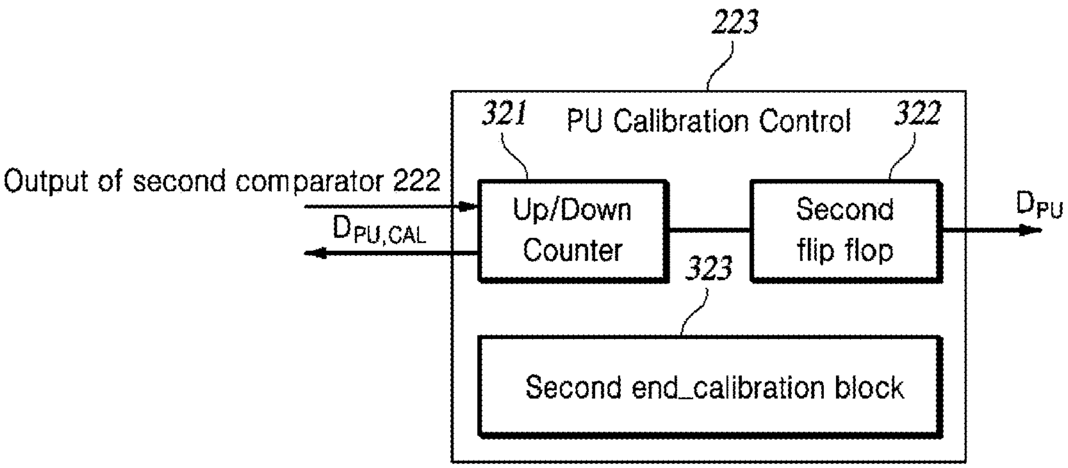
FIG. 3B is a diagram illustrating a configuration of a PU calibration control block 223.

FIG. 3*a* is a diagram illustrating a configuration of the PD calibration control block 213, and FIG. 3*b* is a diagram illustrating a configuration of the PU calibration control block 223.

The PD calibration control block 213 includes an up/down counter 311, a first flip-flop 312, and a first end_calibration block 313.

The up/down counter 311 receives the output of the first comparator 212 as an input and generates a $D_{PD,CAL}$ signal for controlling the first PD driver 211 based on a value of the input.

After the PD calibration has been completed, the first flip-flop 312 stores $D_{PD}$, which is a control value upon completion of PD calibration, and outputs $D_{PD}$ to the memory interface driving circuit 100.

The first end_calibration block 313 performs a function of determining whether or not the PD calibration has been completed.

The PU calibration control block 223 includes an up/down counter 321, a second flip-flop 322, and a second end_calibration block 323.

The up/down counter 321 receives the output of the second comparator 222 as an input and generates a $D_{PU,CAL}$ signal for controlling the PU driver 221 based on a value of the input.

After the PU calibration has been completed, the second flip-flop 322 stores $D_{PU}$, which is a control value at the time of completion of the PU calibration, and outputs $D_{PU}$ to the memory interface driving circuit 100.

The second end_calibration block 323 performs ae function of determining whether the PU calibration has been completed.

Figure 4:
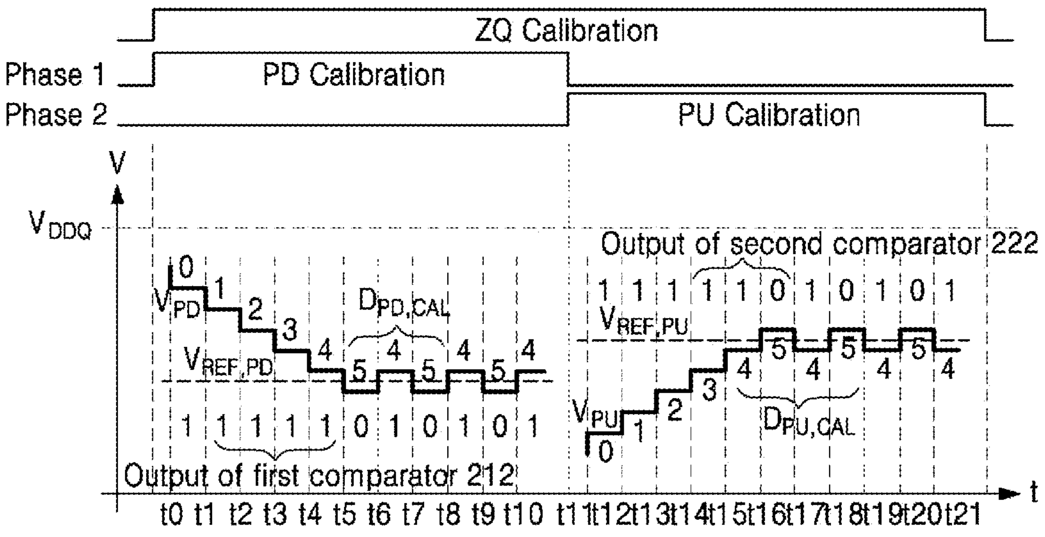
FIG. 4 is a diagram illustrating main operation waveforms of the impedance correction circuit 200.

FIG. 4 is a diagram illustrating main operation waveforms of the impedance correction circuit 200.

In the PD calibration in the impedance correction circuit 200, the first comparator 212 compares the voltage $V_{PD}$ with the voltage $V_{REF,PD}$ and generates 1 as an output when $V_{PD}$ is higher than $V_{REF,PD}$ as illustrated in FIG. 4.

When the output of the first comparator 212 becomes 1, the up/down counter 311 changes the $D_{PD,CAL}$ signal so that the sub pull-down drivers in the first PD driver 211 are additionally turned on one by one to control the first PD driver 211, and $V_{PD}$ gradually decreases depending on the change in the $D_{PD,CAL}$ signal while the output of the first comparator 212 is being maintained at 1.

When the sub pull-down drivers of the first PD driver 211 are additionally turned on one by one by the $D_{PD,CAL}$ signal changing while the output of the first comparator 212 is being maintained at 1, $V_{PD}$ becomes lower than $V_{REF,PD}$ and the output of the first comparator 212 becomes 0 at a point in time t5 as illustrated in FIG. 4.

When the output of the first comparator 212 becomes 0, the up/down counter 311 turns one of the sub pull-down drivers that is on in the first PD driver 211 off again, the $V_{PD}$ voltage becomes higher than $V_{REF,PD}$ again at a point in time t6, and the output of the first comparator 212 becomes 1.

Therefore, as illustrated in FIG. 4, after t5, the output of the first comparator 212 repeats 0 and 1, and the $V_{PD}$ voltage has a waveform that repeatedly increases and decreases with respect to the $V_{REF,PD}$ voltage as the $D_{PD,CAL}$ signal changes under the control of the PD calibration control block 213.

In addition, in a PU calibration operation in FIG. 4, it can be confirmed that the second comparator 222 compares a $V_{PU}$ voltage ((−) terminal) with a $V_{REF,PU}$ voltage ((+) terminal), the output of the second comparator 222 repeats 0 and 1 depending on a result of the comparison after a point in time t16, and the $V_{PU}$ voltage has a waveform that repeatedly increases and decreases with respect to the $V_{REF,PU}$ voltage as the $D_{PU,CAL}$ signal changes under the control of the PD calibration control block 223.

A process of determining with what control value the calibration has been completed in the process of performing the PD calibration and the PU calibration is required. In other words, a process of determining final $D_{PD}$ and $D_{PU}$ from the changing $D_{PD,CAL}$ and $D_{PU,CAL}$ values is required.

A simplest method is a method of performing comparison operations in the first comparator 212 by the number of all the sub pull-down drivers inside the first PD driver 211 and then determining a last determined $D_{PD,CAL}$ value as a $D_{PD}$ value in the case of PD calibration. For example, when the first PD driver 211 includes 10 sub pull-down drivers, 10 comparisons are performed as illustrated in FIGS. 4, and 4, which is the last $D_{PD,CAL}$ value determined at a point in time t10, is determined as a final $D_{PD}$ value.

For the PU calibration, there is a method of performing comparison operations in the second comparator 222 by the number of all the sub pull-up drivers inside the PU driver 221 and then determining a last determined $D_{PU,CAL}$ value as the $D_{PU}$ value, similar to PD calibration.

Another method is a method of determining whether or not the calibration has been completed using output patterns of the comparators the first comparator 212 and the second comparator 222.

In FIG. 4, in PD calibration, when the output of the first comparator 212 shows a pattern of repeating 0 and 1 after time t5, and 0 and 1 are repeated a preset number of times, a determination is made that PD calibration has been completed, and the $D_{PD,CAL}$ values at this time may be determined as the $D_{PD}$ value.

Similarly, in the PU calibration, when the output of the second comparator 222 shows a pattern of repeating 0 and 1 after time t16 and 0 and 1 are repeated a preset number of times, a determination may be made that the PU calibration has been completed and the $D_{PU,CAL}$ values may be determined as the $D_{PU}$ value.

However, the impedance correction circuit 200 may be vulnerable to external noise in the output impedance correction process due to a single-ended circuit configuration, and an incorrect calibration result may be determined due to this noise.

Figure 5:
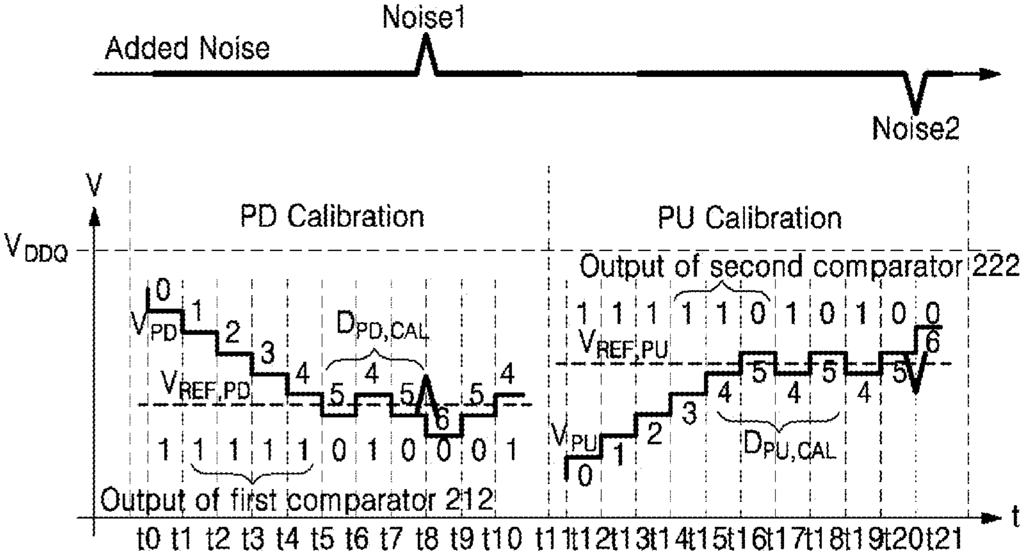
FIG. 5 is a diagram illustrating a case where an incorrect calibration result is derived when external noise is applied.

FIG. 5 is a diagram illustrating a case where an incorrect calibration result is derived when external noise has been applied.

Here, the description will be made assuming that the pull-down calibration is determined to have been completed when the output of the first comparator 212 repeats 0 and 1 twice or more in a pull-down calibration process. In relation thereto, description of the pull-up calibration will be omitted and only the pull-down calibration will be described since both the pull-down calibration and the pull-up calibration occur similarly.

In FIG. 5, when noise having a form and magnitude indicated as Noise1 is applied to a $V_{PD}$ node at a point in time t8, $V_{PD}$ momentarily becomes higher than $V_{REF,PD}$ at the point in time t8. Therefore, the output of the first comparator 212, which should originally be 1, changes to 0 due to Noise1.

Therefore, the output of the first comparator 212, which should originally have a pattern in which 0 and 1 are repeated as 0101 from t5 to t8, changes to 0100 due to Noise1 at t8, and thus, a determination is made that the calibration has not been completed and the calibration may continue even after t8.

Further, since it becomes difficult to form an output pattern of the first comparator 212 in which 0 and 1 are repeated when continuous noise rather than temporary noise such as Noise1 is applied to the $V_{PD}$ node, the calibration may not be completed.

Further, problems caused by noise when a method of performing the comparison operations in the second comparator 222 by a number of times corresponding to the number of all the sub pull-down drivers inside the PU driver 221 and then determining the last determined $D_{PU,CAL}$ value as the $D_{PU}$ value is used will be described.

In FIG. 5, in the pull-up calibration process, when noise having a form and magnitude indicated as Noise2 is applied to the $V_{PU}$ node at a point in time t21, a voltage at the $V_{PU}$ node is momentarily lower than $V_{REF,PU}$ at the point in time t21, an output of the second comparator 222, which should be 1 when there is no Noise2, changes to 0, the $D_{PU,CAL}$ value changes to 6 instead of 4, and the $D_{PU}$ value which is a final calibration value becomes 6, causing an incorrect calibration result to be used in the memory interface driving circuit 100.

In the example in FIG. 5, a specific type of noise at a specific timing is illustrated as an example in order to describe how noise can affect derivation of the calibration result and cause an error, and in reality, noise from various sources such as power noise, thermal noise, and 1/f nose continuously affects the output impedance correction circuit.

Further, an operation power voltage of the memory interface driving circuit is gradually decreasing due to the miniaturization of a memory manufacturing process, an increasing data transmission speed per pin, and increasing power consumption. A supply voltage $V_{DDQ}$ of a data driving circuit is around 1.2 to 1.0 V up to LPDDR4, but is 0.6 V in LPDDR4X, 0.5 V in LPDDR5, and 0.4 V in a recent HBM3 memory. Accordingly, an operation power voltage of an output impedance correction circuit for the data driving circuit must also decrease to the same level, and therefore, a likelihood of an error occurring due to noise having the same magnitude is gradually increasing.

In general, the memory interface driving circuit 100 is designed so that the output impedance can be adjusted in a range of about 4 to 5 bits.

For example, when an interface driving circuit for an LPDDR5 memory is configured so that a supply voltage for a data driving circuit is 0.5 V, logic low data driving is performed at 0 V, logic high data driving is performed at 0.25 V, and output impedance can be linearly adjusted in a 4-bit magnitude, a magnitude of a signal has a change of approximately 15.6 mV (0.25÷2^4) if the output impedance is adjusted by one level.

Incidentally, considering noise caused by various causes such as power noise, thermal noise, and 1/f noise, a magnitude of the noise ranges from a few mV to several tens of mV.

Therefore, as described through the example of FIG. 5, malfunction of the output impedance correction circuit may occur due to an influence of noise components, and a large output impedance correction error due to the noise may occur when a supply voltage of the memory interface driving circuit gradually decreases because of reasons such as power consumption.

Figure 6:
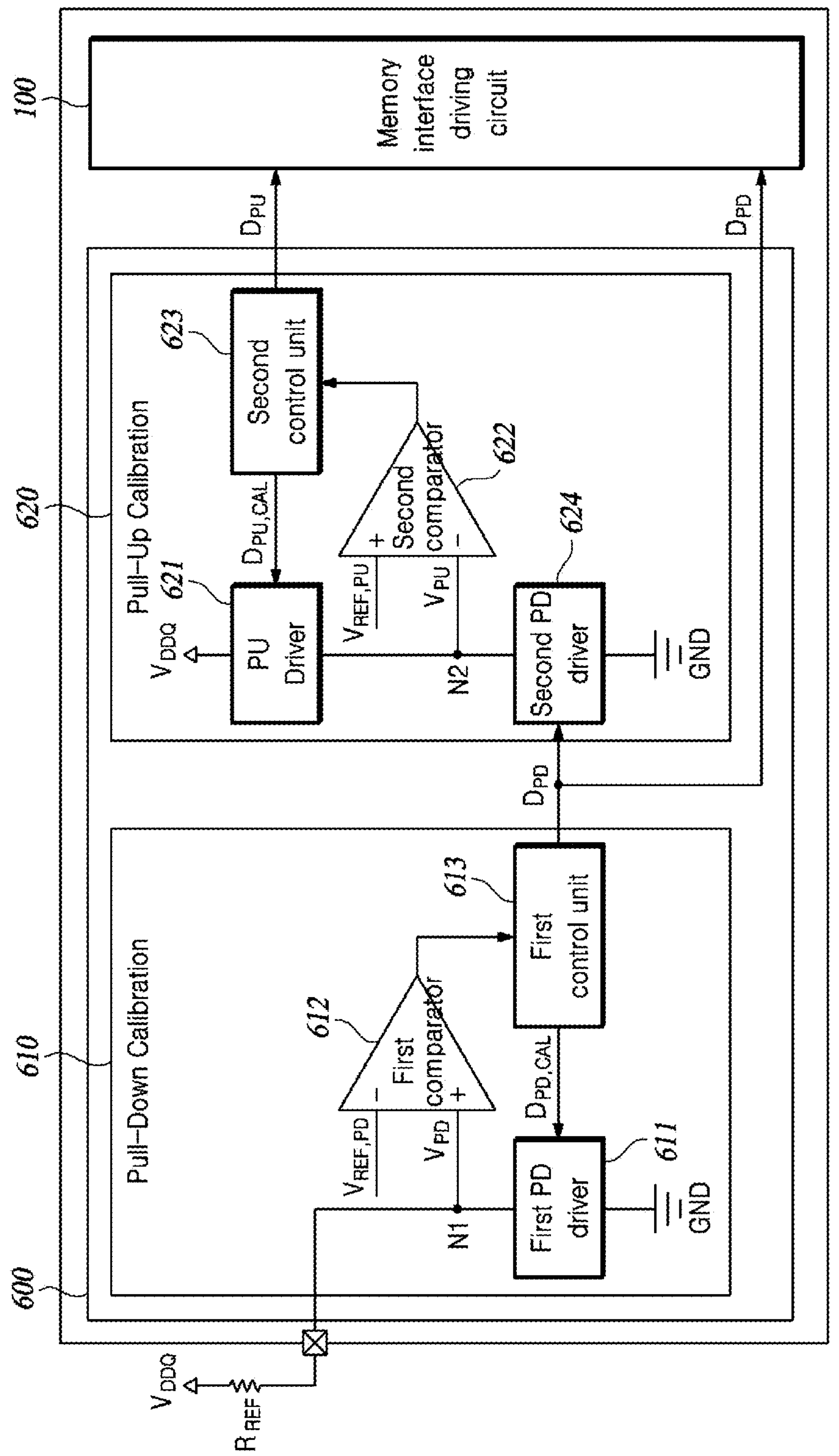
FIG. 6 is a block diagram illustrating a configuration of an output impedance correction apparatus according to the embodiment of the present disclosure.

FIG. 6 is a block diagram illustrating a configuration of the output impedance correction apparatus according to the embodiment of the present disclosure.

As illustrated in FIG. 6, an output impedance correction apparatus 600 according to the present embodiment may include a pull-down calibration unit 610 and a pull-up calibration unit 620.

The pull-down calibration unit 610 includes a first PD driver 611, a first comparator 612, and a first control unit 613.

The pull-up calibration unit 620 includes a PU driver 621, a second comparator 622, a second control unit 623, and a second PD driver 624.

Figure 7A:
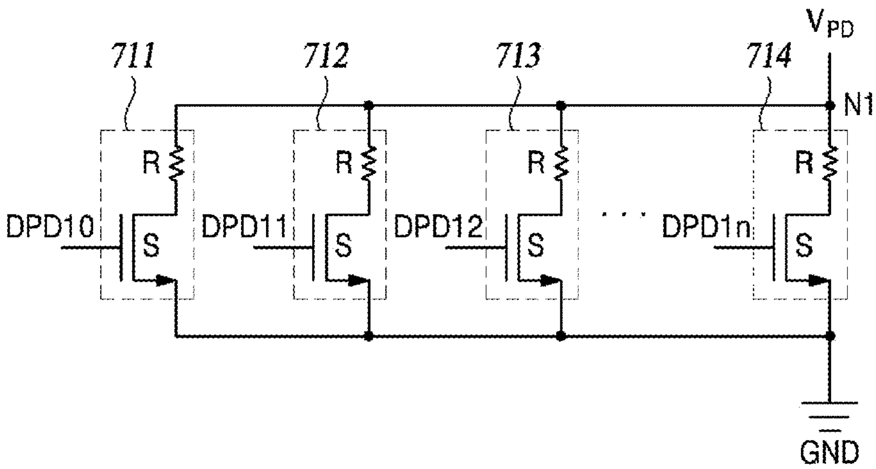
FIG. 7A is a diagram illustrating a configuration of a first PD driver 611.
Figure 7B:
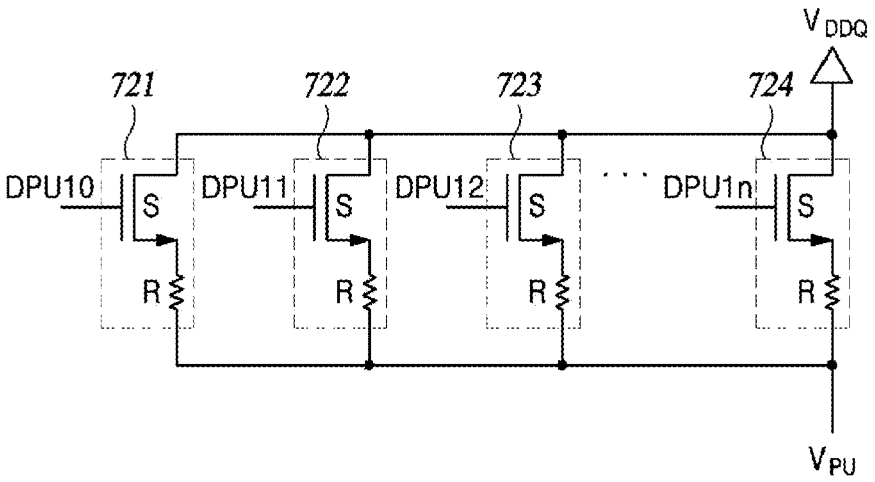
FIG. 7B is a diagram illustrating a configuration of a PU driver 621.
Figure 7C:
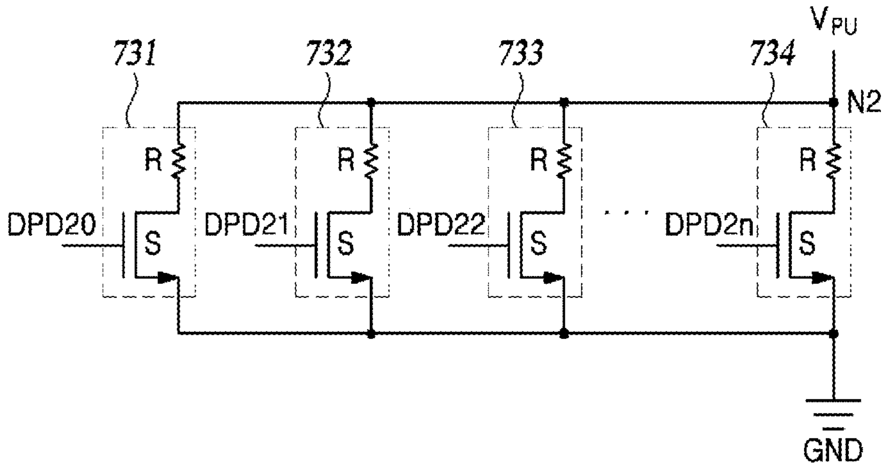
FIG. 7C is a diagram illustrating a configuration of a second PD driver 624.

FIG. 7A is a diagram illustrating a configuration of the first PD driver 611, FIG. 7B is a diagram illustrating a configuration of the PU driver 621, and FIG. 7C is a diagram illustrating a configuration of the second PD driver 624.

The output impedance correction apparatus 600 functions to correct the output impedance of the memory interface driving circuit 100.

Hereinafter, the output impedance correction apparatus 600 according to the present embodiment will be described with reference to FIGS. 1 and 6 to 7C.

As illustrated in FIG. 1, the memory interface driving circuit 100 includes the pull-down driver 110 and the pull-up driver 120.

The pull-down driver 110 includes a plurality of sub pull-down drivers 111, 112, 113, and 114 connected to each other in parallel.

The plurality of sub pull-down drivers 111, 112, 113, and 114 may be implemented as switch elements having the same characteristics.

The plurality of sub pull-down drivers 111, 112, 113, and 114 are controlled so that sub pull-down drivers 111, 112, 113, and 114 are turned on or off by the control signals DPD0, DPD1, DPD2, . . . , DPDn. Hereinafter, a combination of control signals DPD0, DPD1, DPD2, . . . , DPDn is referred to as a first impedance correction code (that is, $D_{PD}$).

In the pull-up driver 120, the plurality of sub pull-up drivers 121, 122, 123, and 124 are connected to each other in parallel.

The plurality of sub pull-up drivers 121, 122, 123, and 124 may be implemented as elements having the same characteristics.

The plurality of sub pull-up drivers 121, 122, 123, and 124 are controlled so that the sub pull-up drivers 121, 122, 123, and 124 are turned on or off by control signals DPU0, DPU1, DPU2, . . . , DPUn. Hereinafter, a combination of the control signals DPU0, DPU1, DPU2, . . . , DPUn is referred to as a second impedance correction code (that is, $D_{PU}$).

The output impedance correction apparatus 600 determines the first impedance correction code (that is, $D_{PD}$) and the second impedance correction code (that is, $D_{PU}$).

The first PD driver 611 includes a plurality of first sub PD drivers 711, 712, 713, and 714 connected to each other in parallel. Each of the first sub PD drivers 711, 712, 713, and 714 may further include a MOS switch element S and a resistor element R connected in series thereto.

The connection structure of the plurality of first sub PD drivers 711, 712, 713, and 714 is formed to be the same as that of the plurality of sub pull-down drivers 111, 112, 113, and 114.

One terminal of the reference resistor $R_{REF}$ is connected to an output terminal N1 of the first PD driver 611, and the other terminal of the reference resistor $R_{REF}$ is connected to a first power supply $V_{DDQ}$. The other terminal of the first PD driver 611 is connected to a ground terminal GND.

The first control unit 613 generates respective gate signals (that is, first control signals) DPD10, DPD11, DPD12, . . . , DPD1*n* for turning the first sub PD drivers 711, 712, 713, and 714 on or off. Hereinafter, a combination of the first control signals formed as DPD10, DPD11, DPD12, . . . , DPD1*n* is referred to as a first control code (that is, $D_{PD,CAL}$).

The first comparator 612 generates a first output pattern that is a sequence of 0 or 1 depending on a result of comparing an output voltage of the first PD driver 611 generated according to the first control code determined in a certain time unit with the first reference voltage.

The second PD driver 624 includes a plurality of second sub PD drivers 731, 732, 733, and 734 connected to each other in parallel. Each of the second sub PD drivers 731, 732, 733, and 734 may further include a MOS switch element S, and a resistor element R connected in series thereto.

A connection structure of the plurality of second sub PD drivers 731, 732, 733, and 734 is formed to be the same as that of the plurality of first sub PD drivers 711, 712, 713, and 714.

Gate signals DPD20, DPD21, DPD22, . . . , DPD2*n* for turning the second sub PD drivers 731, 732, 733, and 734 of the second PD driver 624 on or off are determined as a first impedance correction code $D_{PD}$ provided by the first control unit 613. Details regarding a method of generating the first impedance correction code $D_{PD}$ using the first control unit 613 will be described later.

One terminal of the PU driver 621 is connected to an output terminal N2 of the second PD driver 624, and the other terminal of the PU driver 621 is connected to the first power supply $V_{DDQ}$.

The PU driver 621 includes a plurality of sub PU drivers 721, 722, 723, and 724 connected to each other in parallel. Each of the sub PU drivers 721, 722, 723, and 724 may further include a MOS switch element S, and a resistor element R connected in series thereto.

A connection structure of the plurality of sub PU drivers 721, 722, 723, and 724 has the same form as that of the plurality of sub pull-up drivers 121, 122, 123, and 124.

The second control unit 623 generates respective gate signals (that is, second control signals) DPU10, DPU11, DPU12, . . . , DPU1*n* for turning the plurality of sub PU drivers 721, 722, 723, and 724 on or off. Hereinafter, a combination of the second control signals formed as DPU10, DPU11, DPU12, . . . , DPU1*n* is referred to as a second control code (that is, $D_{PU,CAL}$).

The second comparator 622 generates a second output pattern that is a sequence of 0 or 1 depending on a result of comparing an output voltage of the second PD driver 624 generated according to the second control code determined in a certain time unit with a second reference voltage.

Figure 8:
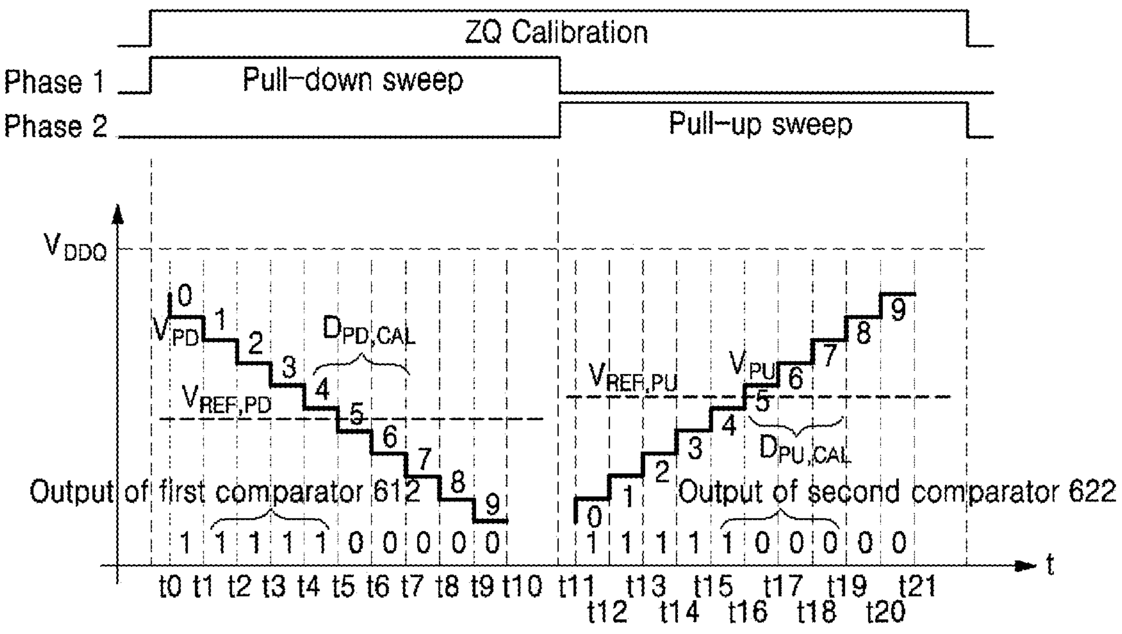
FIG. 8 is a diagram illustrating main operation waveforms of an output impedance correction apparatus 600 according to the present embodiment.
Figure 9:
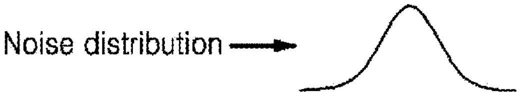
FIG. 9 illustrates a method of determining a first impedance correction code or a second impedance correction code when pull-down sweep or pull-up sweep is performed multiple times.

FIG. 8 is a diagram illustrating main operation waveforms of the output impedance correction apparatus 600 according to the present embodiment, and FIG. 9 illustrates a method of determining the first impedance correction code or the second impedance correction code when the pull-down sweep or the pull-up sweep is performed multiple times.

In one pull-down sweep, the first control unit 613 sequentially changes the combination of the first control signals DPD10, DPD11, DPD12, . . . , DPD1*n* into different values at regular time intervals to provide a resultant combination to the first sub PD driver 711, 712, 713, and 714 in the first PD driver 611. That is, the first control code (that is, $D_{PD,CAL}$) has a value that changes sequentially over time.

For example, as illustrated in FIG. 8, in one pull-down sweep, the $D_{PD,CAL}$ code is set so that all the first sub PD drivers 711, 712, 713, and 714 of the first PD driver 611 are turned off at a first point in time t0 and then, a magnitude of output impedance of the first PD driver 611 is controlled in stages while changing the $D_{PD,CAL}$ code so that the first sub PD drivers 711, 712, 713, and 714 are additionally turned on one by one at regular time intervals (t1, t2, . . . , t10).

The first comparator 612 receives an output voltage $V_{PD}$ of the first PD driver 611 via a (+) terminal, receives the first reference voltage $V_{REF,PD}$ via a (−) terminal, and compares a magnitude of $V_{PD}$ with a magnitude of the first reference voltage $V_{REF,PD}$ to output 0 or 1 depending on a result of the comparison.

In one pull-down sweep, the magnitude of the $V_{PD}$ changes temporally depending on temporal change in the first control code generated by the first control unit 613, and the first comparator 612 generates the first output pattern that is the sequence of 0 or 1 depending on temporal change in the $V_{PD}$. That is, the first output pattern as illustrated in FIG. 9 can be generated.

In one pull-down sweep, the first control unit 613 sequentially generates the first control codes $D_{PD,CAL}$ in different combinations of DPD10, DPD11, DPD12, . . . , DPD1*n*, and generates the first output pattern that is the sequence of 0 or 1 that is generated based on a plurality of first control codes $D_{PD,CAL}$.

As illustrated in FIG. 9, the first control unit 613 may perform the pull-down sweep as illustrated in FIG. 8 multiple times (for example, four times). That is, the first control unit 613 repeatedly generates a plurality of first control codes $D_{PD,CAL}$ in each pull-down sweep and provides the first control codes $D_{PD,CAL}$ to the first PD driver 611.

In each pull-down sweep, the first comparator 612 compares the magnitude of the output voltage $V_{PD}$ of the first PD driver 611 with the first reference voltage $V_{REF,PD}$, and generates the first output pattern that is a sequence of 0 or 1 depending on a result of the comparison.

That is, in each pull-down sweep, the first comparator 612 generates the first output pattern once and generates the same number of first output patterns as the number of pull-down sweeps.

The first control unit 613 calculates the first average of the numbers of 0s or 1s for the first output patterns accumulated multiple times (that is, the number of pull-down sweeps), and determines the first impedance correction code depending on the first average.

That is, the first control unit 613 calculates the number of 0s or 1s for each acquired first output pattern, divides the calculated number of 0s or 1s by the number of pull-down sweeps to calculate the first average of the numbers of 0s or 1s. For example, as illustrated in FIG. 9, the first control unit 613 calculates the numbers of 1s, that is, 5, 4, 6, and 5 in each pull-down sweep (first to fourth output patterns), calculates an average of the numbers as 5+4+6+5)/5, and calculates a result value of 5 as the first average.

Further, the first control unit 613 may calculate a first accumulated number of 1s or 0s included in the first output patterns accumulated multiple times and determine the first impedance correction code depending on the first accumulated number.

Here, the multiple times (that is, the number of pull-down sweeps) may be implemented as the number of times corresponding to $2^n$ (where n is a natural number equal to or greater than 1).

Hereinafter, a pull-up sweep process will be described.

The first control unit 613 determines the first impedance correction code $D_{PD}$ and then provides $D_{PD}$ as a control signal (that is, gate signal DPD20, DPD21, DPD22, . . . , DPD2*n*) for turning the second sub-PD drivers 731, 732, 733, and 734 of the second PD driver 624 on or off.

In the second PD driver 624, the output of the output terminal N2 is determined by the first impedance correction code $D_{PD}$.

The output terminal N2 is connected to the (−) terminal of the second comparator 622, and the second reference voltage $V_{REF,PU}$ is input to the (+) terminal of the second comparator 622.

The second comparator 622 compares an output voltage $V_{PU}$ of the second PD driver 624 with the second reference voltage $V_{REF,PU}$, and outputs 0 or 1 depending on a result of the comparison.

In one pull-up sweep, the second control unit 623 sequentially changes the combination of the second control signals DPU10, DPU11, DPU12, . . . , DPU1*n* into different values at regular time intervals to provide a resultant combination to the respective sub PU drivers 721, 722, 723, and 724 in the PU driver 621. That is, the second control code (that is, $D_{PU,CAL}$) has a value that changes sequentially over time.

For example, as illustrated in FIG. 8, in one pull-up sweep, the $D_{PU,CAL}$ code is set so that all the sub PU drivers 721, 722, 723, and 724 of the PU driver 621 are turned off at the first point in time t11, and then, a magnitude of the output impedance of the PU driver 621 is controlled in stages while the $D_{PU,CAL}$ code being changed so that the sub PU drivers 721, 722, 723, and 724 are additionally turned on one by one at regular time intervals (t12, t13, . . . , t21).

The second comparator 622 receives the output voltage $V_{PU}$ of the PU driver 621 via the (−) terminal, receives the second reference voltage $V_{REF,PU}$ via the (+) terminal, and compares the magnitude of $V_{PU}$ with a magnitude of the second reference voltage $V_{REF}$ to output 0 or 1 depending on a result of the comparison.

In one pull-up sweep, a magnitude of the $V_{PU}$ changes temporally depending on temporal change in the second control code generated by the second control unit 623, and the second comparator 622 generates the second output pattern that is a sequence of 0 or 1 depending on the temporal change of the $V_{PU}$. That is, a second output pattern as illustrated in FIG. 9 can be generated.

In one pull-up sweep, the second control unit 623 sequentially generates the second control codes $D_{PU,CAL}$ in different combinations of DPU10, DPU11, DPU12, . . . , DPU1*n*, and generates the second output pattern that is the sequence of 0 or 1 that is generated based on a plurality of second control codes $D_{PU}$.

As illustrated in FIG. 9, the second control unit 623 can perform the pull-up sweep as illustrated in FIG. 8 multiple times (for example, four times). That is, the second control unit 623 repeatedly generates a plurality of second control codes $D_{PU,CAL}$ and provides the second control codes to the PD driver 621 in each pull-up sweep.

In each pull-up sweep, the second comparator 622 compares a magnitude of an output voltage $V_{PU}$ of the PU driver 621 with a magnitude of the second reference voltage $V_{REF,PU}$, and generates a second output pattern that is a sequence of 0 or 1 depending on a result of the comparison.

That is, the second comparator 622 generates the second output pattern once in each pull-up sweep, and generates the same number of second output patterns as the number of pull-up sweeps.

The second control unit 623 calculates a second average of the numbers of 0s or 1s for the second output patterns accumulated multiple times (that is, the number of pull-up sweeps), and determines the second impedance correction code depending on the second average.

That is, the second control unit 623 calculates the number of 0s or 1s for each acquired second output pattern, and divides the calculated number of 0s or 1s by the number of pull-up sweeps to calculate the second average of the numbers of 0s or 1s. For example, as illustrated in FIG. 9, the second control unit 623 calculates the numbers of 1, that is, 5, 4, 6, and 5 in each pull-down sweep (first to fourth output patterns), calculates an average of the numbers as 5+4+6+5)/5, and calculates a result value of 5 as the second average.

Further, the second control unit 623 may calculate a second accumulated number of 1s or 0s included in the second output patterns accumulated multiple times and determine the second impedance correction code depending on the second accumulated number.

Here, the multiple times (that is, the number of pull-up sweeps) may be implemented as the number of times corresponding to $2^n$ (where n is a natural number equal to or greater than 1).

Figure 10:
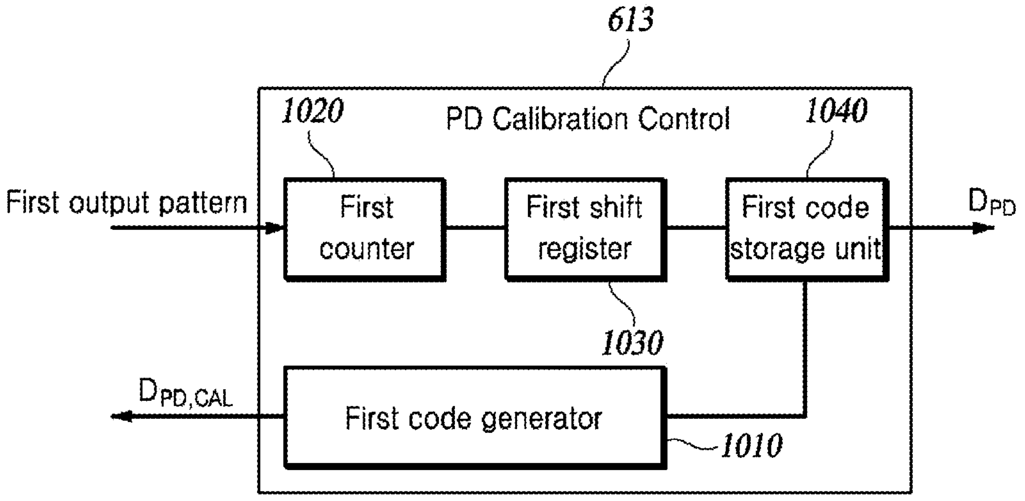
FIG. 10 is a diagram illustrating a configuration of a first control unit 613.

FIG. 10 is a diagram illustrating a configuration of the first control unit 613.

The first control unit 613 may include a first code generator 1010, a first counter 1020, a first shift register 1030, and a first code storage unit 1040.

The first code generator 1010 generates $D_{PD,CAL}$ in each pull-down sweep.

The first counter 1020 receives the first output pattern corresponding to $D_{PD,CAL}$ in each pull-down sweep and counts the number of 1s.

The first counter 1020 receives the same number of first output patterns as the preset number of pull-down sweeps and adds up the number of 1s included in the first output patterns in the respective pull-down sweeps. For example, the first counter 1020 counts all 1's in four pull-down sweeps as illustrated in FIG. 9 and calculates a value of 20 as a first counting result.

The first shift register 1030 receives the first counting result, divides the first counting result by the number of pull-down sweeps, and transfers the obtained first average value to the first code storage unit 1040. For example, when the number of pull-down sweeps is $2^n$, the first shift register 1030 shifts the first counting result to the right by n bits to calculate the first average value.

The first code storage unit 1040 selects $D_{PD,CAL}$ corresponding to the first average value among $D_{PD,CAL}$ corresponding to the respective pull-down sweeps and determines $D_{PD,CAL}$ as the first impedance correction code $D_{PD}$.

Figure 11:
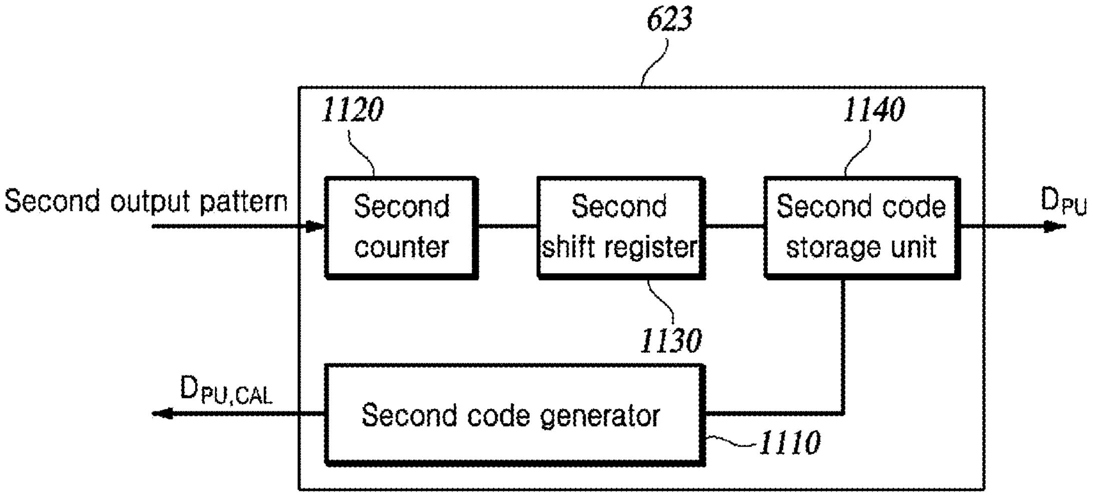
FIG. 11 is a diagram illustrating a configuration of a second control unit 623.

FIG. 11 is a diagram illustrating a configuration of the second control unit 623.

The second control unit 623 may include a second code generator 1110, a second counter 1120, a second shift register 1130, and a second code storage unit 1140.

The second code generator 1110 generates $D_{PU,CAL}$ in each pull-up sweep.

The second counter 1120 receives the second output pattern corresponding to the $D_{PU,CAL}$ in each pull-up sweep and counts the number of 1s.

The second counter 1120 receives the same number of second output patterns as the preset number of pull-up sweeps and adds up the numbers of 1s included in the second output patterns in the respective pull-up sweeps. For example, the second counter 1120 counts all the numbers of 1's in the four pull-up sweeps as illustrated in FIG. 9 to calculates a value of 20 as a second counting result.

The second shift register 1130 receives the second counting result, divides the second counting result by the number of pull-up sweeps, and transfers the obtained second average value to the second code storage unit 1140. For example, when the number of pull-up sweeps is $2^n$, the second shift register 1130 shifts the second counting result to the right by n bits to calculate the second average value.

The second code storage unit 1140 selects $D_{PU,CAL}$ corresponding to the second average value among $D_{PU,CAL}$ corresponding to the respective pull-up sweeps and determines $D_{PU,CAL}$ as the second impedance correction code $D_{PU}$.

Figure 12:
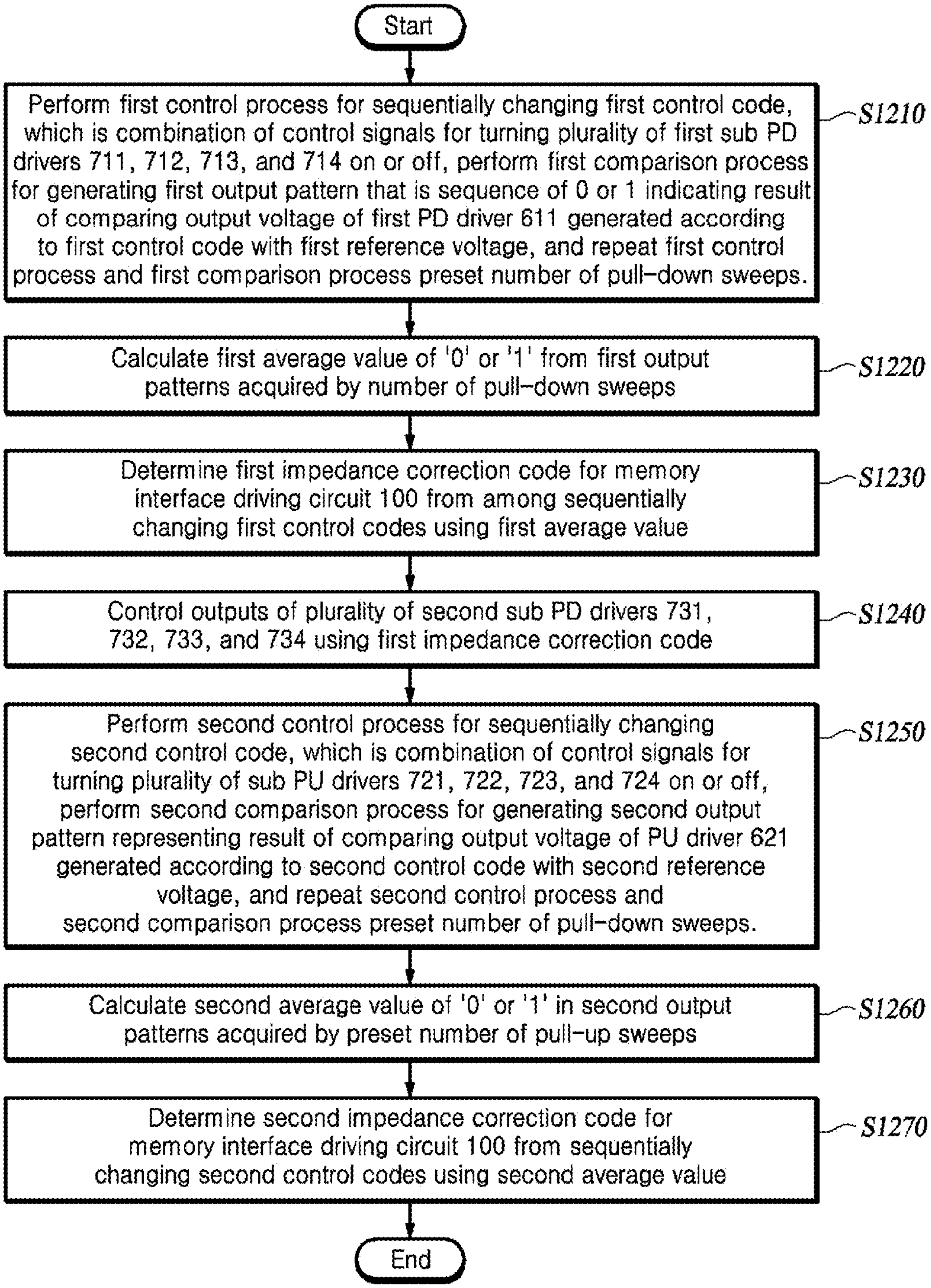
FIG. 12 is a flowchart illustrating an output impedance correction method using the output impedance correction apparatus 600 according to the embodiment of the present disclosure.

FIG. 12 is a flowchart illustrating an output impedance correction method using the output impedance correction apparatus 600 according to an embodiment of the present disclosure.

The first control unit 613 performing a first control process for sequentially changing the first control code, which is a combination of control signals for turning the plurality of first sub PD drivers 711, 712, 713, and 714 on or off in each pull-down sweep, and the first comparator 612 performs a first comparison process for generating the first output pattern that is a sequence of 0 or 1 indicating the result of comparing the output voltage of the first PD driver 611 generated according to the first control code with the first reference voltage (S1210).

Here, a combination of the first control process with the first comparison process in S1210 is one pull-down sweep process, and the pull-down sweep process is repeated a preset number of pull-down sweeps.

After the pull-down sweep process is repeated as the preset number of pull-down sweeps, the first control unit 613 calculates the first average value of '0' or '1' from the first output patterns acquired by the number corresponding to the number of pull-down sweeps (S1220).

The first control unit 613 performs a process of determining the first impedance correction code for the memory interface driving circuit 100 from among sequentially changing first control codes using the first average value calculated in S1220 (S1230).

The first control unit 613 controls outputs of the plurality of second sub PD drivers 731, 732, 733, and 734 using the first impedance correction code S1240.

The second control unit 623 performs a second control process for sequentially changing the second control code, which is a combination of control signals for turning the plurality of sub PU drivers 721, 722, 723, and 724 on or off in each pull-up sweep, and the second comparator 622 performs a second comparison process for generating the second output pattern representing a result of comparing the output voltage of the PU driver 621 generated according to the second control code with the second reference voltage (S1250).

Here, a combination of a second control process with a second comparison process in S1250 is one pull-up sweep process, and the pull-up sweep process is repeated a preset number of pull-up sweeps.

After the pull-up sweep process is repeated the preset number of pull-up sweeps, the second control unit 623 calculates the second average value of '0' or '1' in the second output patterns acquired by the number corresponding to the preset number of pull-up sweeps (S1260).

The second control unit 623 determines the second impedance correction code for the memory interface driving circuit 100 from sequentially changing second control codes using the second average value calculated in S1260 (S1270).

Figure 13:
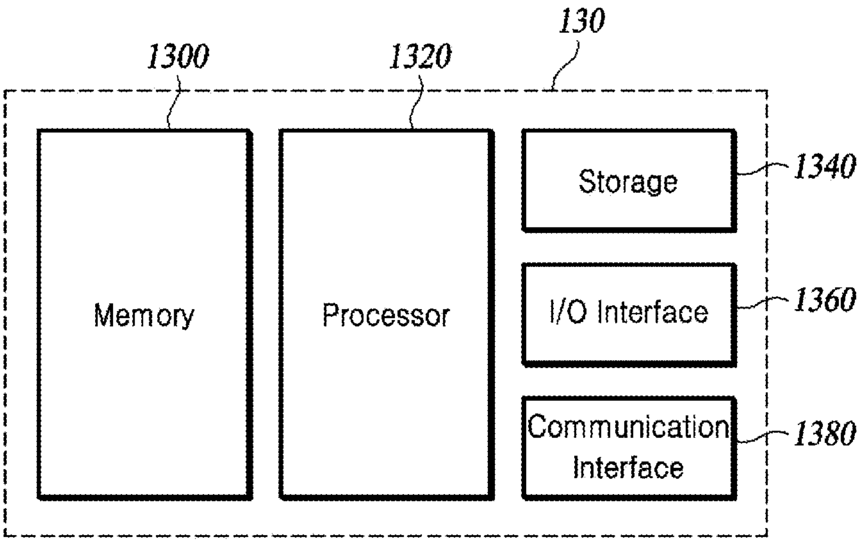
FIG. 13 is a block diagram schematically showing an exemplary computing device that can be used to implement the method or apparatus according to the present disclosure.

FIG. 13 is a block diagram schematically showing an exemplary computing device that can be used to implement the method or apparatus according to the present disclosure.

The computing device 130 may include some or all of a memory 1300, a processor 1320, a storage 1340, an input/output interface 1360, and a communication interface 1380. The computing device 130 may structurally and/or functionally include at least a portion of a pull-down calibration unit 610 or a pull-up calibration unit 620. The computing device 130 may be a stationary computing device such as a desktop computer, a server, and an AI accelerator, and may be f mobile computing device such as a laptop computer and a smartphone.

The memory 1300 may store a program that causes the processor 1320 to perform method or operations according to various embodiments of the present disclosure. For example, the program may include a plurality of instructions executable by the processor 1320, and the method shown in FIG. 12 may be performed by the processor 1320 executing the plurality of instructions.

The memory 1300 may be a single memory or a plurality of memories. In this case, information required to perform methods or operations according to various embodiments of the present disclosure may be stored in a single memory or stored in a plurality of memories in a distributed manner. When the memory 1300 is configured as a plurality of memories, the plurality of memories may be physically separated.

The memory 1300 may include at least one of a volatile memory and a non-volatile memory. The volatile memory includes a static random access memory (SRAM) or a dynamic random access memory (DRAM), and the non-volatile memory includes a flash memory.

The processor 1320 may include at least one core capable of executing at least one instruction. The processor 1320 may execute instructions stored in the memory 1300. The processor 1320 may be a single processor or a plurality of processors.

The storage 1340 maintains stored data even if power supplied to the computing device 130 is cut off. For example, the storage 1340 may include a non-volatile memory or may include storage media such as a magnetic tape, an optical disk, and a magnetic disk.

The program stored in the storage 1340 may be loaded into the memory 1300 before being executed by the processor 1320. The storage 1340 may store files written in a program language, and a program created from a file by a compiler or the like may be loaded into the memory 1300. The storage 1340 may store data to be processed by processor 1320 and/or data processed by processor 1320.

The input/output interface 1360 may include an input device such as a keyboard and a mouse, and may include an output device such as a display device and a printer. A user may trigger execution of a program by the processor 1320 and/or check processing results of the processor 1320 through the input/output interface.

The communication interface 1380 may provide access to external networks. For example, the computing device 130 may communicate with other devices through the communication interface 1380.

The components described in the example embodiments may be implemented by hardware components including, for example, at least one digital signal processor (DSP), a processor, a controller, an application-specific integrated circuit (ASIC), a programmable logic element, such as an FPGA, other electronic devices, or combinations thereof. At least some of the functions or the processes described in the example embodiments may be implemented by software, and the software may be recorded on a recording medium. The components, the functions, and the processes described in the example embodiments may be implemented by a combination of hardware and software.

The method according to example embodiments may be embodied as a program that is executable by a computer, and may be implemented as various recording media such as a magnetic storage medium, an optical reading medium, and a digital storage medium.

Various techniques described herein may be implemented as digital electronic circuitry, or as computer hardware, firmware, software, or combinations thereof. The techniques may be implemented as a computer program product, i.e., a computer program tangibly embodied in an information carrier, e.g., in a machine-readable storage device (for example, a computer-readable medium) or in a propagated signal for processing by, or to control an operation of a data processing apparatus, e.g., a programmable processor, a computer, or multiple computers. A computer program(s) may be written in any form of a programming language, including compiled or interpreted languages and may be deployed in any form including a stand-alone program or a module, a component, a subroutine, or other units suitable for use in a computing environment. A computer program may be deployed to be executed on one computer or on multiple computers at one site or distributed across multiple sites and interconnected by a communication network.

Processors suitable for execution of a computer program include, by way of example, both general and special purpose microprocessors, and any one or more processors of any kind of digital computer. Generally, a processor will receive instructions and data from a read-only memory or a random access memory or both. Elements of a computer may include at least one processor to execute instructions and one or more memory devices to store instructions and data. Generally, a computer will also include or be coupled to receive data from, transfer data to, or perform both on one or more mass storage devices to store data, e.g., magnetic, magneto-optical disks, or optical disks. Examples of information carriers suitable for embodying computer program instructions and data include semiconductor memory devices, for example, magnetic media such as a hard disk, a floppy disk, and a magnetic tape, optical media such as a compact disk read only memory (CD-ROM), a digital video disk (DVD), etc. and magneto-optical media such as a floptical disk, and a read only memory (ROM), a random access memory (RAM), a flash memory, an erasable programmable ROM (EPROM), and an electrically erasable programmable ROM (EEPROM) and any other known computer readable medium. A processor and a memory may be supplemented by, or integrated into, a special purpose logic circuit.

The processor may run an operating system (OS) and one or more software applications that run on the OS. The processor device also may access, store, manipulate, process, and create data in response to execution of the software. For purpose of simplicity, the description of a processor device is used as singular, however, one skilled in the art will be appreciated that a processor device may include multiple processing elements and/or multiple types of processing elements. For example, a processor device may include multiple processors or a processor and a controller. In addition, different processing configurations are possible, such as parallel processors.

Also, non-transitory computer-readable media may be any available media that may be accessed by a computer, and may include both computer storage media and transmission media.

The present specification includes details of a number of specific implements, but it should be understood that the details do not limit any invention or what is claimable in the specification but rather describe features of the specific example embodiment. Features described in the specification in the context of individual example embodiments may be implemented as a combination in a single example embodiment. In contrast, various features described in the specification in the context of a single example embodiment may be implemented in multiple example embodiments individually or in an appropriate sub-combination. Furthermore, the features may operate in a specific combination and may be initially described as claimed in the combination, but one or more features may be excluded from the claimed combination in some cases, and the claimed combination may be changed into a sub-combination or a modification of a sub-combination.

Similarly, even though operations are described in a specific order on the drawings, it should not be understood as the operations needing to be performed in the specific order or in sequence to obtain desired results or as all the operations needing to be performed. In a specific case, multitasking and parallel processing may be advantageous. In addition, it should not be understood as requiring a separation of various apparatus components in the above described example embodiments in all example embodiments, and it should be understood that the above-described program components and apparatuses may be incorporated into a single software product or may be packaged in multiple software products.

It should be understood that the example embodiments disclosed herein are merely illustrative and are not intended to limit the scope of the invention. It will be apparent to one of ordinary skill in the art that various modifications of the example embodiments may be made without departing from the spirit and scope of the claims and their equivalents.

Accordingly, one of ordinary skill would understand that the scope of the claimed invention is not to be limited by the above explicitly described embodiments but by the claims and equivalents thereof.

What is claimed is:

1. An apparatus for correcting output impedance of a memory interface driving circuit, the output impedance correction apparatus comprising:

a first pull-down (PD) driver including a plurality of first sub PD drivers connected to each other in parallel;

a first control unit configured to sequentially change a first control code, the first control code being a combination of control signals for turning the plurality of first sub PD drivers on or off in each PD sweep; and a first comparator configured to generate a first output pattern, the first output pattern being a sequence of 0 or 1 representing a result of comparing an output voltage of the first PD driver generated according to the first control code with a first reference voltage, wherein the first control unit is configured to accumulate the first output patterns by a preset number of PD sweeps according to the first control code, and determine a first impedance correction code based on the accumulated first output patterns.

2. The output impedance correction apparatus of claim 1, wherein one terminal of a reference resistor is connected to an output terminal of the first PD driver, and a first power supply is connected to the other terminal of the reference resistor.

3. The output impedance correction apparatus of claim 1, wherein the first control unit is configured to calculate a first average in each PD sweep of the numbers of 0s or 1s included in the accumulated first output patterns, and determines the first impedance correction code depending on the first average.

4. The output impedance correction apparatus of claim 3, wherein the first control unit is configured to calculate a first accumulated number of 1s or 0s included in the accumulated first output patterns and divides the first accumulated number by the number of PD sweeps to calculate the first average.

5. The output impedance correction apparatus of claim 1, wherein the first control unit includes:

a first code generation unit configured to sequentially generate a first control code in each round of PD sweep;

a first counter configured to count the number of 0s or 1s included in the first output pattern in each PD sweep to generate a first counting result;

a first shift register configured to shift the first counting result to the right by a certain number of bits to calculate a first average value; and a first code storage unit configured to select the first control code corresponding to the first average value from among the first control codes corresponding to the respective PD sweeps and determines the first control code as the first impedance correction code.

6. The output impedance correction apparatus of claim 5, wherein the number of PD sweeps is set to a number times corresponding to $2^n$ (where n is a natural number equal to or greater than) 1.

7. The output impedance correction apparatus of claim 6, wherein the first shift register is configured to shift the first counting result to the right by n bits to calculate the first average value.

8. The output impedance correction apparatus of claim 5, wherein the first code storage unit is configured to provide the first impedance correction code to the memory interface driving circuit.

9. The output impedance correction apparatus of claim 1, further comprising:

a second PD driver including a plurality of second sub PD drivers connected to each other in parallel, wherein outputs of the plurality of second sub PD drivers are configured to be controlled using the first impedance correction code.

10. The output impedance correction apparatus of claim 9, further comprising:

a pull-up (PU) driver including a plurality of sub PU drivers connected to each other in parallel and having an output terminal connected to an output terminal of the second PD driver;

a second control unit configured to sequentially change a second control code, the second control code being a combination of control signals for turning the plurality of sub PU drivers on or off; and a second comparator configured to generate a second output pattern representing a result of comparing an output voltage of the first PU driver generated according to the second control code with a second reference voltage, wherein the second control unit is configured to determine a second impedance correction code for the memory interface driving circuit from among the sequentially changing second control codes using the second output pattern.

11. The output impedance correction apparatus of claim 10, wherein the memory interface driving circuit includes a PD driver including a plurality of sub PD drivers connected to each other in parallel, and a PU driver including a plurality of sub PU drivers connected to each other in parallel, wherein a connection structure of the plurality of sub PD drivers is the same as that of the plurality of first sub PD drivers, and wherein a connection structure of the plurality of sub PU drivers is the same as that of the plurality of sub PU drivers.

12. A method of correcting output impedance of a memory interface driving circuit using an output impedance correction apparatus including a plurality of first sub pull-down (PD) drivers connected to each other in parallel, the method comprising:

a first control operation of sequentially changing a first control code, the first control code being a combination of control signals for turning the plurality of first sub PD drivers on or off in each PD sweep; and a first comparison operation of generating a first output pattern, the first output pattern being a sequence of 0 or 1 representing a result of comparing an output voltage of the first PD driver generated according to the first control code with a first reference voltage, wherein the first control operation includes accumulating the first output patterns by a preset number of PD sweeps according to the first control code, and determining a first impedance correction code based on the accumulated first output patterns.

13. The output impedance correction method of claim 12, wherein the first control operation includes calculating a first average in each PD sweep of the numbers of 0s or 1s included in the accumulated first output patterns, and determining the first impedance correction code depending on the first average.

14. The output impedance correction method of claim 13, wherein the first control operation includes calculating a first accumulated number of 0s or 1s included in the accumulated first output patterns and dividing the first accumulated number by the number of PD sweeps to calculate the first average.

15. The output impedance correction method of claim 12, wherein the number of PD sweeps is set to a number times corresponding to $2^n$, (where n is a natural number equal to or greater than) 1.

16. The output impedance correction method of claim 15, wherein the first control operation includes shifting the first counting result to the right by n bits to calculate a first average value.

17. The output impedance correction method of claim 12, wherein the output impedance correction apparatus further includes a second PD driver including a plurality of second sub PD drivers connected to each other in parallel, and wherein the output impedance correction method further comprises controlling outputs of the plurality of second sub PD drivers using the first impedance correction code.

18. The output impedance correction method of claim 17, wherein the output impedance correction apparatus further includes a pull-up (PU) driver including a plurality of sub PU drivers connected to each other in parallel and having an output terminal connected to an output terminal of the second PD driver, and wherein the output impedance correction method further comprises:

a second control operation of sequentially changing a second control code, the second control code being a combination of control signals for turning the plurality of sub PU drivers on or off in each PU sweep; and a second comparison operation of generating a second output pattern representing a result of comparing an output voltage of the first PU driver generated according to the second control code with a second reference voltage, wherein the second control operation includes determining a second impedance correction code for the memory interface driving circuit from among the sequentially changing second control codes using the second output pattern.

* * * * *